United States Patent [19]
Brun et al.

[11] Patent Number: 5,434,879
[45] Date of Patent: Jul. 18, 1995

[54] GAIN-SWITCHED SEMICONDUCTOR LIGHT PULSE SOURCE, AND A SOLITON TRANSMISSION SYSTEM

[75] Inventors: Elisabeth Brun; José Chesnoy, both of Paris; Jean-Pierre Hamaide, Saint Germain les Arpajon; Dominique Lesterlin, Paris, all of France

[73] Assignee: Alcatel N.V., Amsterdam, Netherlands

[21] Appl. No.: 182,507

[22] Filed: Jan. 18, 1994

[30] Foreign Application Priority Data

Jan. 19, 1993 [FR] France ................. 93 00473

[51] Int. Cl.⁶ .............................................. H01S 3/18
[52] U.S. Cl. ...................................... 372/50; 359/188; 372/26
[58] Field of Search ............... 372/96, 20, 26, 50; 359/173, 188

[56] References Cited

U.S. PATENT DOCUMENTS

| | | | |
|---|---|---|---|
| 4,719,636 | 1/1988 | Yamaguchi | 372/50 |
| 4,920,542 | 4/1990 | Brosson et al. | 372/50 |
| 5,177,758 | 1/1993 | Oka et al. | 372/96 |
| 5,325,382 | 6/1994 | Emura et al. | 372/26 |

OTHER PUBLICATIONS

Y. Sakakibara "Single-Mode Oscillation Under High-Speed Direct Modulation in GaInAsP/InP Integrated Twin-Guide Lasers with Distributed Bragg", *Electronics Letters*, vol. 16, No. 12, Jun. 5, 1980, pp. 456–457.

Japanese Patent Abstract 63-299291 dated Dec. 6, 1988.

D. M. Spirit et al "Nonlinear, dispersion free 10GHz optical pulse train transmission in distributed erbium dopde fibre", *Electronics Letters*, vol. 27, No. 3, Jan. 31, 1991, pp. 222–224.

J. M. Lourtioz et al "Transform limited gain-switched DFB lasers pulses for long haul soliton trans-transmission", *EFOC/LAN 19992, Tenth Annual European Optical Communications and Networks Conference, Jun. 24–26, 1992*, pp. 273–275.

French Search Report FR 9300473 dated Oct. 24, 1993.

*Primary Examiner*—John D. Lee
*Attorney, Agent, or Firm*—Sughrue, Mion, Zinn, Macpeak & Seas

[57] ABSTRACT

An electrical power supply (20, 22) powers a semiconductor laser chip (2) under gain switching conditions so as to make the chip emit light pulses. The light pulses are compressed in a fiber (30) having negative dispersion, so that they constitute solitons. Their spectrum width is decreased by the fact that a gain segment powered by the power supply constitutes only a portion of the length of the resonant cavity of the chip. The invention applies to transmitting data over optical fibers.

8 Claims, 1 Drawing Sheet

GAIN-SWITCHED SEMICONDUCTOR LIGHT PULSE SOURCE, AND A SOLITON TRANSMISSION SYSTEM

BACKGROUND OF THE INVENTION

The present invention relates to forming short light pulses that can be used in particular for transmitting data over an optical fiber. It is known that the combined action of dispersive optical effects and of Kerr-type non-linear effects that are imparted by such a fiber enables suitably-shaped pulses referred to as "solitons" to propagate without being deformed. That is why using such pulses is being considered for high-rate transoceanic transmission (6,000 km–9,000 km). Such long transmission distances can be achieved by propagating solitons along fibers in which losses are compensated by optical amplifiers having erbium-doped fibers.

Soliton transmission requires a train of periodically-emitted short light pulses. For example, for 10 Gbit/s transmission, each pulse must measure about 20 ps (at half-intensity). Furthermore, the pulses must be "close to the Fourier limit", i.e. a critical product which is the product of the duration of a pulse multiplied by its spectrum width must be less than a limit of about 0.7, and must be as close as possible to an optimum value of 0.32.

In a first known method, such pulses can be generated by mode coupling in a semiconductor laser having an external cavity. That method is described by D. M. Bird, R. M. Fatah, M. K. Cox, P. D. Constantine . . . , Electronics Letters 26, p. 2086 (1990). A second known method uses gain switching in a monolithic semiconductor laser, and is described by a Document by Downey: L. M. Downey, J. F. Bowers, R. S. Tucker and E. Agyekum, IEEE, J. Quant. Elec. QE 23, 1039 (1987).

The first method requires a complex laser which is difficult to use. It would therefore be difficult to consider using that method on site.

The second method makes it possible to emit pulses which have very wide spectrum widths which means they are far from the Fourier limit. Such spectrum widths result from the fact that laser gain switching is obtained by injecting a current that varies considerably. The optical frequency then varies considerably during each of the pulses produced because of the fact that the refractive index of the material making up the laser cavity depends on the current. Such variation in the refractive index results in a corresponding variation in the optical length of the laser cavity, and therefore in the resonance optical frequency of the cavity during the delivered pulse. As a result, the pulse has its rising edge formed by a wave of higher optical frequency than that of its falling edge (FIG. 2).

That variation in frequency may be used to reduce the duration of the pulse by using a known "compression" method. In that method, the pulse passes through an optical medium whose optical path length depends on optical frequency. In particular, a special fiber having highly offset dispersion (in which the wavelength that cancels the dispersion is greater than the central wavelength of the pulse emitted by the laser) has a longer optical path length for high frequencies than for low frequencies.

The variation in frequency therefore enables the rising edge to be delayed relative to the falling edge: by adjusting the length of the fiber, a pulse is formed whose corrected duration is much shorter than its initial duration, and whose critical product is therefore close to the desired ideal value.

In particular, a known DFB laser delivers pulses, each of which has a critical product of about 0.75 when compressed.

SUMMARY OF THE INVENTION

In particular, objects of the invention are to enable the following to be made simply: firstly, a semiconductor chip delivering raw light pulses of reduced spectrum width, and secondly a source containing the chip, and a dispersive line delivering compressed light pulses of reduced spectrum width, and suitable for constituting solitons.

To these ends, the present invention provides a semiconductor light pulse source including a semiconductor chip with two faces, in which chip a longitudinal waveguide structure constitutes a resonant cavity for laser light, the cavity containing an active material so that the chip amplifies and emits such laser light at a frequency controlled by the optical length of the structure, the source further including an electrical power supply which gain switches the chip so as to make it emit said light in the form of light pulses, the source being characterized by the fact that, along the length of said chip, the chip includes not only a gain segment in which said gain switching is performed and is accompanied by interfering variations in refractive index, but also at least one additional segment free from said interfering variations in refractive index.

The additional segment inserts its own optical length into that of the resonant cavity, thereby reducing the relative variation in the optical length of the resonant cavity, and therefore the relative variation in the optical frequency at which the light pulses are output by the chip, i.e. the additional segment reduces the spectrum width of the pulses. The reduction in the spectrum width of the light pulses is retained after optimum compression.

An embodiment of the present invention is described below with reference to the accompanying diagrammatic drawing. When the same element is shown in more than one figure, it is designated by the same reference.

DESCRIPTION OF A PREFERRED EMBODIMENT

Figure 1:
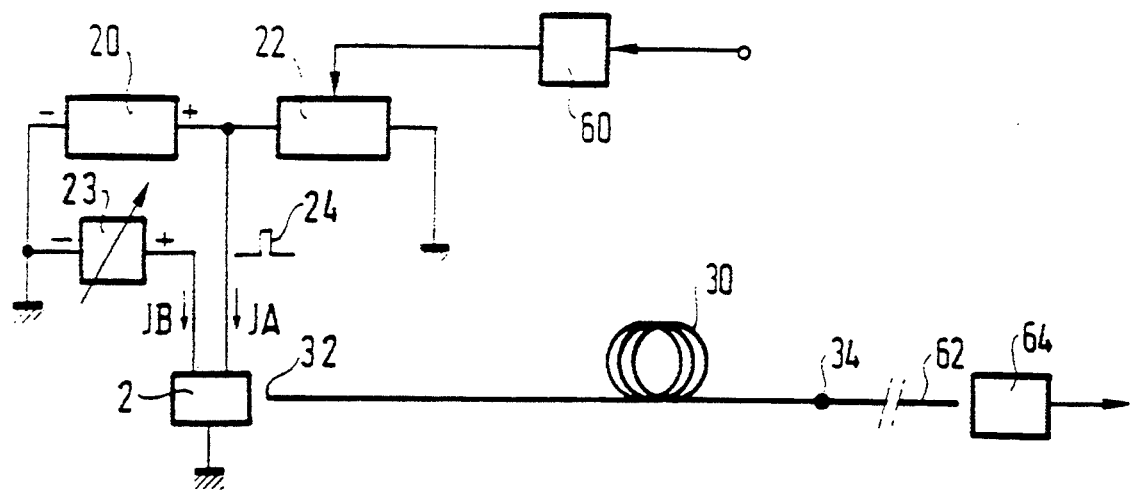
FIG. 1 is an overall view showing a source and a transmission system of the present invention.
Figure 2:
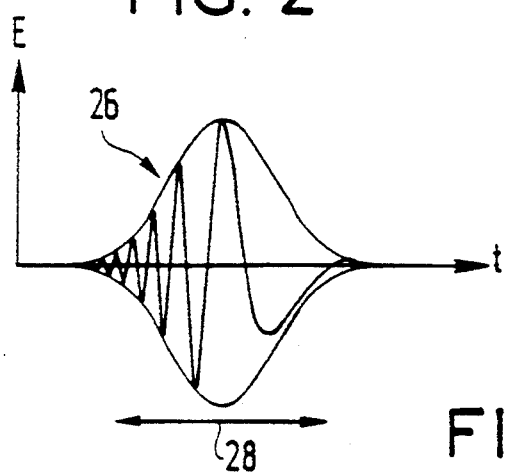
FIGS. 2 and 3 are diagrams showing the variation in the electrical field of light pulses respectively at the output of a semiconductor chip and at the output of a dispersive line of the source.
Figure 3:
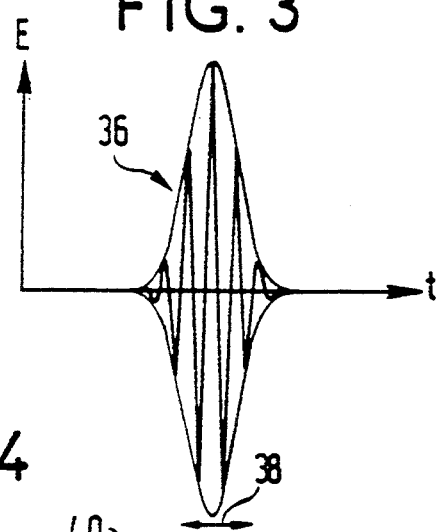
Figure 4:
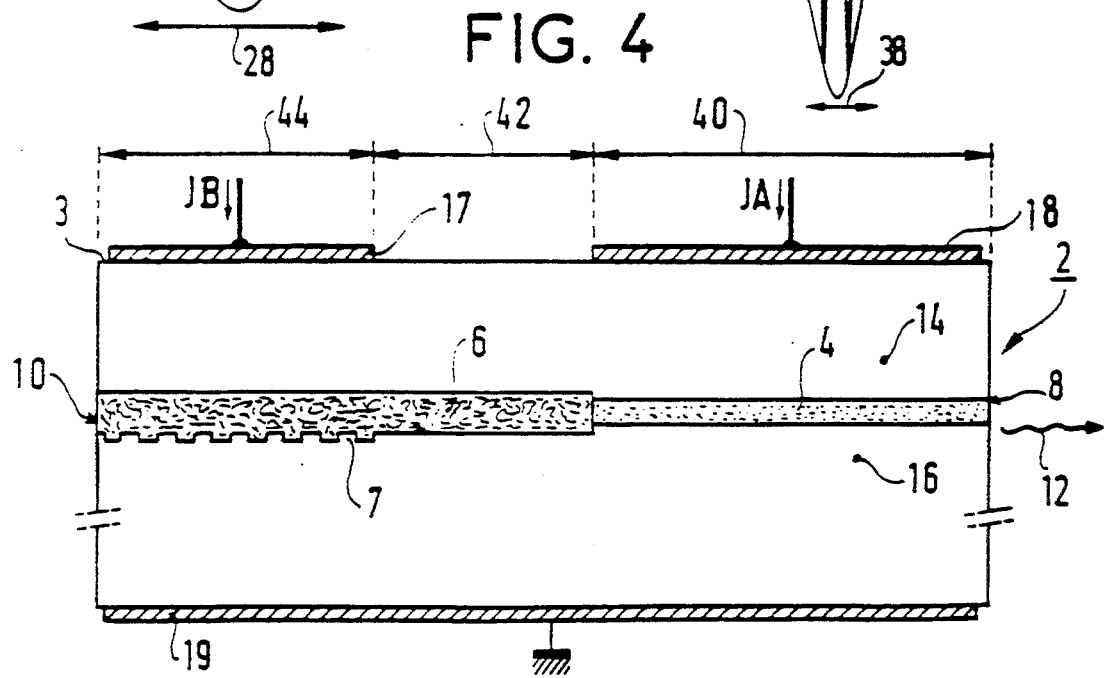
FIG. 4 is a view in section through the semiconductor chip.

With reference to the figures, firstly a general description is given below of the dispositions that are common both to said source of the present invention and also to a prior source disclosed by said Document by Downey, and by a document by Lourtioz: J. M. Lourtioz, J. M. Xie, L. Chusseau, J. L. Beylat, E. Brun, J. P. Hamaide, F. Pommereau published in the EFOC'-LAN 1992 proceedings, p. 273, 1992.

In accordance with the common dispositions, a source includes a monolithic semiconductor chip 2 extending in a longitudinal direction and itself including:

a waveguide structure 4, 6 passing through the chip in said longitudinal direction to guide light in that direction; the structure includes an active material 4 such that injecting opposite-type carriers into the material causes gain to appear so as to amplify laser light guided by the structure; the gain and the refractive index of the material depend on the concentrations of such carriers;

two end faces 8, 10 of the chip form two ends of said waveguide structure and present reflectances so as to cooperate with the structure to constitute a resonant cavity for such laser light; the cavity has an optical length that is dependent on the refractive index of the active material, and has a succession of resonant frequencies that are inversely proportional to the optical length; the reflectance of at least one of said end faces 8 is limited so as to enable said laser light 12 to be emitted from the cavity; and doped layers 14 and 16 situated on either side of said active material 4 and suitable for supplying said opposite-type carriers.

Said source further includes the following elements:

electrodes 18, 19 situated on said chip 2 to enable a powering current JA to be passed therethrough, thereby causing said injection of opposite-type carriers from the layers 14 and 16; such injection causes said laser light to grow in and to be emitted from said cavity at at least one of said resonant frequencies of the cavity;

a power supply 20, 22 supplying said powering current JA to the electrodes; the power supply is chosen to impose variations on the current so as to form current pulses 24 switching said gain; the gain switching is such that the laser light 12 is emitted by the chip 2 in the form of pulses; which pulses constitute raw light pulses 26 and they have an initial duration 28; the variation in said powering current JA forming each such current pulse causes an interfering variation in the refractive index of the active material and therefore a variation in the optical length of the cavity during each of the light pulses; the variation in the optical length is an absolute variation and is accompanied by a relative variation constituted by the ratio of the absolute variation divided by the optical length; the variation in optical length causes an absolute variation in the frequency of the laser light and imparts an initial spectrum width to the light pulse; a relative variation in the frequency is constituted by the ratio of the absolute variation divided by the frequency; said relative variation in the frequency is equal to said relative variation in optical length; and a dispersive line 30 suitable for guiding the laser light and applying a delay thereto dependent on the frequency thereof; the line has an input 32 for receiving the raw light pulses 26 and an output 34 for responding by supplying compressed light pulses 36 having a corrected duration 38. At the central wavelength of the light pulses, the line presents negative chromatic dispersion which imposes a slower propagation speed on the high-frequency optical components than on the low-frequency optical components; the length of the line is chosen so that the corrected duration is minimized.

According to the present invention, the chip 2 has a plurality of successive segments in said longitudinal direction. In a gain segment 40, the waveguide structure 4, 6 includes said active material 4 and receives the injection of carriers caused by the powering current. As a result, varying the current causes an interfering variation in the refractive index of the material. In at least one additional segment 42, 44, the waveguide structure is organized such that no significant variation in refractive index is caused by the variation in the powering current, at least not in the same direction as said interfering variation. The presence of such an additional segment increases the optical length of said cavity and this increase causes various decreases: a decrease in said relative variation in the optical length, therefore a decrease in said relative variation in the frequency of the laser light, therefore a decrease in the absolute variation in this frequency, and therefore finally a decrease in the spectrum width of the pulses.

More particularly, the waveguide structure includes the following elements:

an active strip 4 limited to said gain segment 40 and constituted by the active material; the material has a refractive index that is greater than those of the surrounding materials; and a passive waveguide 6 extending at least through said additional segments 42 and 44; the passive waveguide is made of a waveguide material that is different from the active material, and that also has a refractive index that is greater than those of the surrounding materials.

By means of the presence of the passive waveguide, one of said additional segments can constitute a diffraction grating segment 44. In this segment, the passive waveguide 6 presents a periodic succession of variations in its cross-sectional dimensions, the succession constituting a Bragg reflector 7. The reflector selects a resonant frequency of said optical cavity to constitute the frequency of the laser light 12 emitted by the chip.

Preferably, a top face 3 of said chip 2 carries firstly a gain electrode 18 located in the gain segment 40 and powered by the power supply 20, 22, and secondly a frequency adjustment electrode 17 located in a frequency adjustment segment 44. The frequency adjustment electrode is connected to a frequency adjustment generator 23 to pass a frequency adjustment current JB through the passive waveguide 6, thereby causing opposite-type charge carriers to be injected into the waveguide material. This current also controls the refractive index of the material and therefore the resonant frequency selected by said Bragg reflector 7.

The chip 2 further includes a passive segment 42 constituting another additional segment.

Typically, the chip 2 is constituted by a binary material such as indium phosphide outside of said active strip 4 and of said passive waveguide 6. The binary material is n-type doped in layer 16. It is p-type doped in layer 14. The active material and the waveguide material are ternary or quaternary and have energy forbidden bands that are of different widths.

The present invention also provides a soliton optical transmission system including the following elements:

a semiconductor light pulse source as defined above;

an input circuit 60 receiving data to be transmitted and controlling the power supply 20, 22 for the source so as to make the source supply a succession of light pulses; the time intervals between the pulses are representative of the data;

a line fiber 62 constituted by a very long optical fiber receiving the light pulses; the optical fiber presents chromatic dispersion and a Kerr effect such that the dispersion and the Kerr effect compensate each other to retain the shape of a light pulse when the pulse presents intensity, duration and spectrum width that are characteristic of a soliton of the fiber; the light pulse source of the system supplies such solitons; and a receiver 64 receiving the light pulses transmitted by the line fiber 62; the receiver processes the received pulses so as to restore the data which was to be transmitted.

We claim:

1. In a semiconductor light pulse source comprising: a semiconductor chip (2) with two end faces (8, 10), in which chip a longitudinal waveguide structure (4, 6), having a length, constitutes a resonant cavity for laser light, the cavity containing an active material (4) so that the chip amplifies and emits such laser light at a frequency controlled by the optical length of the structure; doped layers in the chip for supplying opposite-type charge carrier to said active material in response to an electrical powering current; electrodes on the chip for carrying said powering current; and an electrical power supply (20, 22) which supplies said powering current in the shape of current pulses, and which gain switches the chip so as to make it emit said light in the form of light pulses, whereby intensity variation of said powering current during such a pulse causes parasitic variations of a refractive index in said cavity and, accordingly, of said optical frequency;

the improvement wherein, along the length of said chip, the chip (2) includes not only a gain segment (40) in which said gain switching occurs and produces the parasitic variations in refractive index, but also at least one additional segment (42, 44) free from said parasitic variations of refractive index, so as to limit the spectrum width of said light pulses.

2. A source according to claim 1, wherein said chip is a monolithic semiconductor chip (2) extending in a longitudinal direction;

wherein said waveguide structure (4, 6) passes through the chip in said longitudinal direction to guide light in that direction, the structure including said active material (4) such that injecting the opposite-type carriers into the material causes gain to appear so as to amplify laser light guided by the structure, the gain and the refractive index of the material depending on the concentrations of such carriers;

wherein said two end faces (8, 10) form two ends of said waveguide structure and present reflectances so as to cooperate with the structure to constitute said resonant cavity for said laser light, the cavity having an optical length that is dependent on said refractive index of said active material, the cavity having a succession of resonant frequencies that are inversely proportional to the optical length, said reflectance of at least one of said end faces (8) being limited so as to enable said laser light (12) to be emitted from the cavity;

wherein said doped layers (14, 16) are situated on either side of said active material (4), for supplying said opposite-type carriers;

wherein said electrodes (18, 19) are situated on said chip (2) to enable the powering current (JA) to be passed therethrough, thereby causing said injection of opposite-type carriers from said doped layers, so as to cause said laser light to grow in and to be emitted from said cavity at one of said resonant frequencies of the cavity;

wherein said power supply (20, 22) supplies said powering current (JA) to the electrodes and imposes variations on the current to form current pulses (24) enabling said gain to be switched so that said laser light (12) is emitted by said chip in the form of raw light pulses (26) having an initial duration (28), so that varying said powering current (JA) in each of said current pulses causes a variation in the optical length of said cavity during each of said raw light pulses, the variation in the optical length being an absolute variation and being accompanied by a relative variation constituted by the ratio of the absolute variation divided by the optical length, the variations in optical length causing an absolute variation in the frequency of said laser light and imparting an initial spectrum width to the light pulse, a relative variation in the frequency being constituted by the ratio of the absolute variation divided by the frequency, and being equal to said relative variation in optical length;

wherein said source further comprises a dispersive line (30) suitable for guiding said laser light and applying a delay thereto dependent on the frequency thereof, the line having an input (32) for receiving said raw light pulses (26) and an output (34) for responding by supplying compressed light pulses (36) having a corrected duration (38) that is less than said initial duration; and wherein, successively and in said longitudinal direction, said chip (2) not only has said gain segment (40) in which said waveguide structure (4, 6) includes said active material (4) and receives said injection of carriers caused by said powering current so that varying the current causes the parasitic variation in the refractive index of the material, but also said at least one additional segment (42, 44) in which the waveguide structure is organized such that no significant variation in the refractive index is caused by said variation in the powering current in the same direction as said parasitic variation of the refractive index, whereby the optical length of said cavity is increased, and this increase causes a decrease in said relative variation in the optical length, a decrease in said relative variation in the frequency of said laser light, a decrease in said absolute variation in this frequency, and a decrease in said spectrum width.

3. A source according to claim 2, said waveguide structure including:

an active strip (4) limited to said gain segment (40) and constituted by said active material, the material having a refractive index that is greater than those of the surrounding materials; and a passive waveguide (6) extending at least through said additional segment (42, 44), the passive waveguide being made of a material having a refractive index that is greater than those of the surrounding materials.

4. A source according to claim 3, characterized by the fact that one of said additional segments constitutes a diffraction grating segment (44) in which said passive waveguide (6) presents a periodic succession of variations in its cross-sectional dimensions, the succession constituting a Bragg reflector (7) suitable for selecting one of said resonant frequencies of said optical cavity to constitute the frequency of said laser light (12).

5. A source according to claim 4, characterized by the fact that a top face (3) of said chip (2) carries firstly one of said electrodes constituting a gain electrode (18) located in said gain segment (40) and powered by said power supply (20, 22), and secondly a frequency adjustment electrode (17) located in said frequency adjustment segment (44) and connected to a frequency adjustment generator (23) of said source to pass a frequency adjustment current (JB) through said passive waveguide (6), thereby causing opposite-type charge carriers to be injected into said waveguide material, so as to control the refractive index of the material and the resonant frequency selected by said Bragg reflector (7).

6. A source according to claim 4, characterized by the fact that said chip (2) further includes a passive segment (42) constituting one of said additional segments.

7. A source according to claim 3, said chip (2) being constituted by a binary material outside of said active strip (4) and of said passive waveguide (6), the material being n-type doped in a layer (16) extending beneath said waveguide structure (4, 6), and being p-type doped in a layer (14) extending above the waveguide structure, said active material and said waveguide material being ternary or quaternary and having energy forbidden bands that are of different widths.

8. A soliton optical transmission system including:

- a semiconductor light pulse source for supplying light pulses (36) on command;
- an input circuit (60) receiving data to be transmitted and controlling a power supply (20, 22) for the source so as to make the source supply a succession of light pulses, in which succession the time intervals between the pulses are representative of the data to be transmitted;
- a line fiber (62) constituted by a very long optical fiber receiving said succession of light pulses, and presenting chromatic dispersion and a Kerr effect such that the dispersion and the Kerr effect compensate each other to retain the shape of a light pulse when the pulse presents intensity, duration and spectrum width that are characteristic of a soliton of the fiber; and
- a receiver (64) receiving the light pulses transmitted by said line fiber and processing the received pulses so as to restore said data to be transmitted;
- the system being characterized by the fact that said light pulse source is a source according to any one of claims 1, 2, 5, and 7, such that it supplies said light pulses in the form of said solitons of said line fiber (62).

* * * * *